United States Patent
Thomas-Alyea

(10) Patent No.: US 8,855,956 B2
(45) Date of Patent: Oct. 7, 2014

(54) METHOD AND SYSTEM FOR DETERMINING STATE OF CHARGE OF AN ENERGY DELIVERY DEVICE

(75) Inventor: Karen E. Thomas-Alyea, Arlington, MA (US)

(73) Assignee: A123 Systems LLC, Livonia, MI (US)

( * ) Notice: Subject to any disclaimer, the term of this patent is extended or adjusted under 35 U.S.C. 154(b) by 292 days.

(21) Appl. No.: 12/477,382

(22) Filed: Jun. 3, 2009

(65) Prior Publication Data

US 2009/0326842 A1 Dec. 31, 2009

Related U.S. Application Data

(60) Provisional application No. 61/059,137, filed on Jun. 5, 2008.

(51) Int. Cl.
G01R 19/00 (2006.01)
G01R 31/36 (2006.01)

(52) U.S. Cl.
CPC .......... *G01R 31/362* (2013.01); *G01R 31/3648* (2013.01); *G01R 31/3606* (2013.01); *G01R 31/3679* (2013.01)
USPC ............. 702/64; 702/57; 702/63; 702/65

(58) Field of Classification Search
USPC .............. 702/57, 63, 64, 65, 136, 184
See application file for complete search history.

(56) References Cited

U.S. PATENT DOCUMENTS

| 4,140,394 | A * | 2/1979 | Roos | 356/306 |
|---|---|---|---|---|
| 5,631,540 | A | 5/1997 | Nguyen | |
| 2007/0188143 | A1 * | 8/2007 | Plett | 320/132 |
| 2008/0048616 | A1 * | 2/2008 | Paul et al. | 320/132 |
| 2010/0036627 | A1 * | 2/2010 | Bergveld et al. | 702/63 |

FOREIGN PATENT DOCUMENTS

| WO | WO-2005/085889 | 9/2005 |
|---|---|---|
| WO | WO-2008/053410 | 5/2008 |

OTHER PUBLICATIONS

Moo, C., Ng, N., Chen, Y., Hsieh, C. State-of-Charge Estimation with Open-Circuit-Voltage for Lead-Acid Batteries. Power Conversion Conference—Nagoya, 2007.PCC'07 [online], [retrieved May 3, 2011]. Retrieved from the Internet: <http://ieeexplore.ieee.org/stamp/stamp.jsp?tp=&arnumber=4239242&isnumber=4239118>.*
International Search Report and Written Opinion for International Application No. PCT/US2009/046281 mailed Jul. 29, 2009 (8 pages).
Newman, et al., "Restricted Diffusion in Binary Solutions", AIChE J., 19(2):343-348 (1973).
Fuller, et al., "Relaxation Phenomena in Lithium-Ion-Insertion Cells", J. Electrochem. Soc., 141(4):982-990 (1994).

* cited by examiner

*Primary Examiner* — Sujoy Kundu
*Assistant Examiner* — Paul D Lee
(74) *Attorney, Agent, or Firm* — Alleman Hall McCoy Russell & Tuttle LLP

(57) ABSTRACT

A method of determining state of charge of an energy delivery device includes sampling voltage values of the energy delivery device during relaxation of the device. The method further includes regressing an open circuit voltage value and the total overpotential being relaxed. The regression includes a predetermined time constant of relaxation associated with the energy delivery device. One embodiment uses the equation $V(t)=OCV-\alpha \exp(-t/tau)$, where $V(t)$ represents the sampled voltage values, t represents times at which each of the voltage values are sampled, OCV represents the open circuit voltage value of the energy delivery device, α represents the overpotential value, and tau represents the time constant of relaxation. The method uses a predetermined profile that relates open circuit voltage of the energy delivery device to state of charge of the device, to determine a particular state of charge corresponding to the regressed open circuit voltage value.

22 Claims, 5 Drawing Sheets

METHOD AND SYSTEM FOR DETERMINING STATE OF CHARGE OF AN ENERGY DELIVERY DEVICE

CROSS REFERENCE TO RELATED APPLICATIONS

This application claims benefit of U.S. Provisional Patent Application Ser. No. 61/059,137, filed Jun. 5, 2008, the contents of which are hereby incorporated by reference in their entirety.

BACKGROUND OF THE INVENTION

The present invention relates to energy delivery devices, and more particularly, to techniques for evaluating transient characteristics of an energy delivery device to determine its state of charge.

To determine the state of charge (SOC) of an energy delivery device (e.g., a cell or a battery), one typically measures the open-circuit voltage (OCV; i.e., thermodynamic voltage of the cell at rest) and compares the OCV to a previously measured relationship between the OCV and state of charge. FIG. 1, an example of such a profile, shows the cell voltage measured 1.5 hours after interrupting a C/10-rate current that had been applied for 30 minutes. The figure shows data measured following a discharge (lower curve 102) and following a charge (upper curve 104); the two curves may differ because of hysteresis intrinsic to the cell chemistry. However, it can take a long time (over an hour) for a battery to relax to true open-circuit voltage after the current is turned off. In many cases, one wants to take advantage of short rest periods, on the order of a few minutes, to determine the state of charge of the battery.

Existing battery modeling literature describes the general nature of the voltage profile during relaxation. The voltage relaxes because of relaxing of concentration gradients by diffusion formed in the electrolyte and active electrode materials during passage of current. See, for example, papers by Chapman and Newman, AIChE J. 1973 p. 343 vol. 19 and Fuller, Doyle, and Newman, J. Electrochem. Soc., 1994, p. 982. These papers describe the theory that shows that, at sufficiently long times after interruption of current, the voltage profile will follow an exponential decay profile.

Voltage monitoring is used to determine state of charge. However, most published algorithms use a voltage measurement at a single point in time, and assume that the voltage is equal to the OCV. Alternatively, the algorithms use an equivalent circuit model of a cell to model capacitive and/or diffusive voltage transients.

If the rest period is not long enough to allow the cell to reach true OCV, then a single-point measurement will have error. Battery behavior is complex and difficult to match precisely with a simple equivalent-circuit model. A more sophisticated battery model can be used to predict battery behavior more accurately, but such models introduce a significant computational cost.

SUMMARY OF THE INVENTION

The embodiments described herein include techniques to extrapolate the true open-circuit voltage of the battery or other energy delivery device based on voltage data available during the short rest period.

The described embodiments extrapolate the voltage during rest to determine the true OCV. The described embodiments utilize a 2-parameter regression for the extrapolation so that the method is independent of state of health. The embodiments use a single exponential function for the extrapolation, which takes advantage of the theory of diffusion relaxation at long times.

The embodiments described herein may be used for any application that incorporates an energy delivery device, requires a state of charge estimate for that device, but does not typically provide for long rest/relaxation periods during which the energy delivery device can reach its steady state OCV. Examples of such applications include hybrid electric vehicles (HEVs) and electrical grid buffering.

In one aspect, the invention is a method of determining state of charge of an energy delivery device. The method includes sampling voltage values presented by the energy delivery device during a relaxation period of the energy delivery device. The method further includes regressing, with respect to the sampled voltage values, an open circuit voltage value of the energy delivery device and an overpotential value that describes a total overpotential being relaxed. The regression includes a predetermined time constant of relaxation associated with the energy delivery device. The method further includes using a predetermined profile that relates open circuit voltage of the energy delivery device to state of charge of the energy delivery device, to determine a particular state of charge corresponding to the regressed open circuit voltage value. The relationship between open-circuit voltage and state of charge may include a dependence on hysteresis, e.g. by keeping track of the prior charge-discharge history of the cell to determine the present state along the path between fully-saturated charge and discharge hysteresis states.

In one embodiment, the regression uses the equation $V(t) = OCV - \alpha \exp(-t/\text{tau})$, where $V(t)$ represents the sampled voltage values, $t$ represents times at which each of the voltage values are sampled, OCV represents the open circuit voltage value of the energy delivery device, $\alpha$ represents the overpotential value, and tau represents the predetermined time constant of relaxation associated with the energy delivery device.

In another embodiment, the predetermined time constant of relaxation associated with the energy delivery device is generated by applying a current to the energy delivery device, discontinuing the current after a period of time, recording voltages presented by the energy delivery device after the current is discontinued, and plotting a logarithm of a plurality of differences $V_{t\_last} - V_t$. $V_{t\_last}$ is a final voltage recorded after the current is discontinued and $V_t$ is a voltage recorded at time t. The time constant of relaxation is further generated by determining a slope of a linear fit to the plurality of differences $V_{t\_last} - V_t$. The predetermined time constant of relaxation is the inverse of the determined slope.

In another embodiment, the linear fit is determined using the differences $V_{t\_last} - V_t$ only for t greater than N seconds and less than M seconds after discontinuing the current. M is a value selected according to a first time constant associated with a large diffusion component of the energy delivery device. N is a value selected according to a second time constant associated with the energy delivery device that is substantially smaller than the first time constant. The predetermined time constant of relaxation is generated as a function of temperature of the energy delivery device.

In one embodiment, the predetermined time constant of relaxation is chosen with respect to a measured temperature of the energy delivery device. In another embodiment, the predetermined time constant is determined as a function of state of health and/or state of charge of the energy delivery device, in addition to the dependence on temperature. In another embodiment, a sampling interval associated with the sampling is chosen as a function of the predetermined time constant of relaxation of the energy delivery device. In yet another embodiment, the regression uses only the sampled voltage values that were sampled more than N seconds after beginning the relaxation period.

One embodiment further includes combining the determined particular state of charge with one or more state of charge estimates determined by alternative estimating techniques. The alternative estimating techniques includes at least one of coulomb counting, evaluation of an equivalent circuit model corresponding to the energy delivery device, evaluation of a physical cell model corresponding to the energy delivery device, and measurements of one or more of voltage, temperature, a derivative of voltage and a derivative of temperature. The combining may include calculating a weighted sum of the determined particular state of charge and the one or more state of charge estimates determined by alternative techniques.

In another aspect, the invention includes an apparatus for determining the state of charge of an energy delivery device. The apparatus includes a voltage measurement device for sampling voltage values presented by the energy delivery device during a relaxation period of the energy delivery device. The apparatus further includes a processor for regressing, with respect to the sampled voltage values, an open circuit voltage value of the energy delivery device and an overpotential value that describes a total overpotential being relaxed. The regression includes a predetermined time constant of relaxation associated with the energy delivery device. The processor further uses a predetermined profile that relates open circuit voltage of the energy delivery device to state of charge of the energy delivery device, to determine a particular state of charge corresponding to the regressed open circuit voltage value.

In one embodiment, the regression conducted by the processor uses the equation $V(t)=OCV-\alpha \exp(-t/tau)$, where $V(t)$ represents the sampled voltage values, t represents times at which each of the voltage values are sampled, OCV represents the open circuit voltage value of the energy delivery device, $\alpha$ represents the overpotential value, and tau represents the predetermined time constant of relaxation associated with the energy delivery device.

In another embodiment, the predetermined time constant of relaxation included in the regression is chosen with respect to a measured temperature of the energy delivery device. In another embodiment, a sampling interval associated with the sampling is chosen as a function of the predetermined time constant of relaxation of the energy delivery device. In another embodiment, the regression conducted by the processor uses only the sampled voltage values that were sampled more than N seconds after beginning the relaxation period.

In another embodiment, the determined particular state of charge is combined with one or more state of charge estimates determined by alternative estimating techniques. The alternative estimating techniques includes at least one of coulomb counting, evaluation of an equivalent circuit model corresponding to the energy delivery device, evaluation of a physical cell model corresponding to the energy delivery device, and measurements of one or more of voltage, temperature, a derivative of voltage and a derivative of temperature. The combination of the determined particular state of charge and the one or more state of charge estimates determined by alternative estimating may include a weighted sum of the determined particular state of charge and the one or more state of charge estimates determined by alternative techniques.

In another aspect, the invention includes a computer program product, including a computer usable medium having a computer readable program code embodied therein. The computer readable program code is adapted to be executed to implement a method of determining state of charge of an energy delivery device. The medium holds one or more instructions for sampling voltage values presented by the energy delivery device during a relaxation period of the energy delivery device. The medium further holds one or more instructions for regressing, with respect to the sampled voltage values, an open circuit voltage value of the energy delivery device and an overpotential value that describes a total overpotential being relaxed. The regression includes a predetermined time constant of relaxation associated with the energy delivery device. The medium further holds one or more instructions for using a predetermined profile that relates open circuit voltage of the energy delivery device to state of charge of the energy delivery device, to determine a particular state of charge corresponding to the regressed open circuit voltage value.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
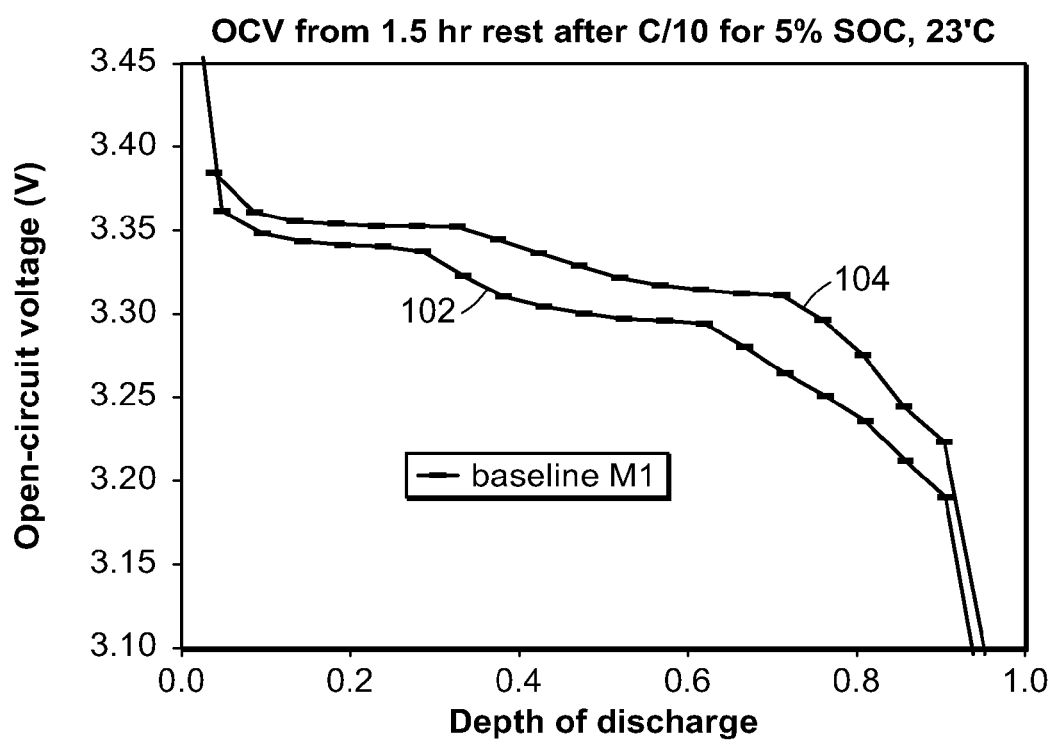
FIG. 1 shows an exemplary profile relating open circuit voltage to state of charge for an energy delivery device.

One embodiment is described as follows. During rest, the voltage of the energy delivery device (e.g., a battery or cell) is measured and recorded (with or without filtering to remove noise) at time intervals of, for example, between about 1 and 30 seconds, typically about 10 seconds. The time interval for data logging can be selected to be some fraction of the characteristic relaxation time constant of the particular battery design of interest. For example, one might choose to log data every 10 seconds for a 200-second time constant. One might choose to log data more frequently for a shorter time constant, or less frequently for a battery with a longer time constant.

At the end of the rest, the embodiment uses the data stored during the rest period to extrapolate the voltage profile to the true OCV by using the following equation:

$$V(t)=OCV-\alpha \exp(-t/tau)$$

where $V(t)$ is the voltage data recorded during the relaxation at each time interval t; OCV is the extrapolated OCV, $\alpha$ is a parameter that describes the total overpotential that is being relaxed, and tau is the time constant of relaxation, which is a function of temperature.

Because the total overpotential depends on many factors, such as temperature, time under previous load, state of charge, and current of previous load, the described embodiment regresses both OCV and $\alpha$ simultaneously to achieve the best estimate of OCV.

A battery is a complex system and its voltage transients have several components, such as diffusion in the electrolyte, diffusion in the anode active material, diffusion in the cathode active material, and capacitance. One could either try to fit the relaxation of all the time constants, or selectively use data that is dominated by the time constant having the largest contribution to the voltage profile. The latter strategy may be achieved by ignoring the voltage data collected during the initial portion of the relaxation period, during which the battery voltage is dominated by capacitance. For example, ignoring the voltage data collected during the period between zero seconds and about 20 seconds after the beginning of the relaxation period (i.e., when current is turned off) removes a significant amount of the voltage data known to be dominated by capacitance.

Tau is measured by fitting to relaxation experiments over the time period of interest, e.g., between 10 and 200 seconds after the current is turned off. Analysis of empirical data has shown that tau is not affected by cell cycling, aging, or state of charge in A123's chemistry. Regarding chemistries for which tau is affected by cell state of health, the dependence of tau on state of health can be characterized in the laboratory, and the on-board state-of-charge algorithm can include a dependence of tau on state of health. In some embodiments associated with chemistries for which the diffusion time constants vary with state of charge of the energy delivery device, tau may be characterized as a function of the state of charge.

Figure 2:
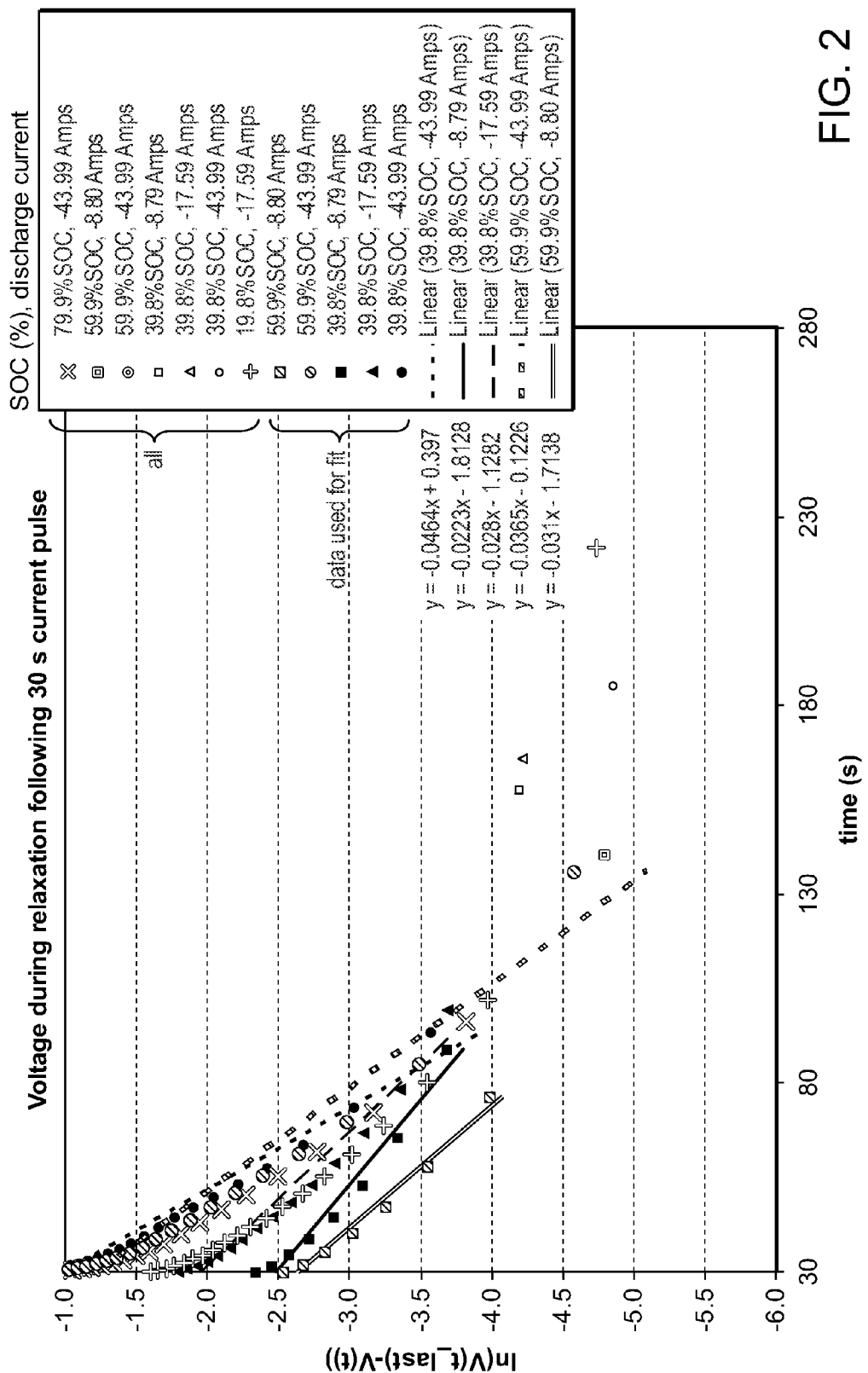
FIG. 2 shows one technique for determining the time constant of relaxation, tau.

FIG. 2 illustrates one technique for determining tau, which should be characterized as a function of temperature in order to implement the embodiment. This technique is used to determine the tau associated with a particular battery prior to the battery being used for its intended application. The technique for determining tau is generally carried out under controlled conditions (e.g., in a laboratory setting), although in some embodiments the technique may be adapted to be executed in a field environment after the battery has been deployed.

To determine tau, an arbitrary current is applied to the cell for an arbitrary length of time, and then the current is turned off and the cell relaxes. The voltage during relaxation is then recorded. The logarithm of the difference $V_{t\_last}-V$, is then plotted, where $V_t$ is the voltage recorded at some time after the current is interrupted, and $V_{t\_last}$ is the final voltage recorded after the current is interrupted.

A linear fit to these data has a slope of 1/tau. FIG. 2 shows tau fit to data collected between about 10 seconds and about 200 seconds after the interruption of the current. The fit demonstrated in FIG. 2 is only an example; the exact time period from which data is used varies with cell design. For example, the end of the time period may be selected to be less than or equal to the time constant of the largest diffusion component of the energy delivery device. The beginning of the time period may be selected to be larger than a capacitive time constant of the energy delivery device or other diffusive time constant that is small with respect to the end of the time period. The example of FIG. 2 demonstrates that the same time constant of about 1/0.03 seconds dominates the data regardless of the current or state of charge preceding relaxation.

Figure 3:
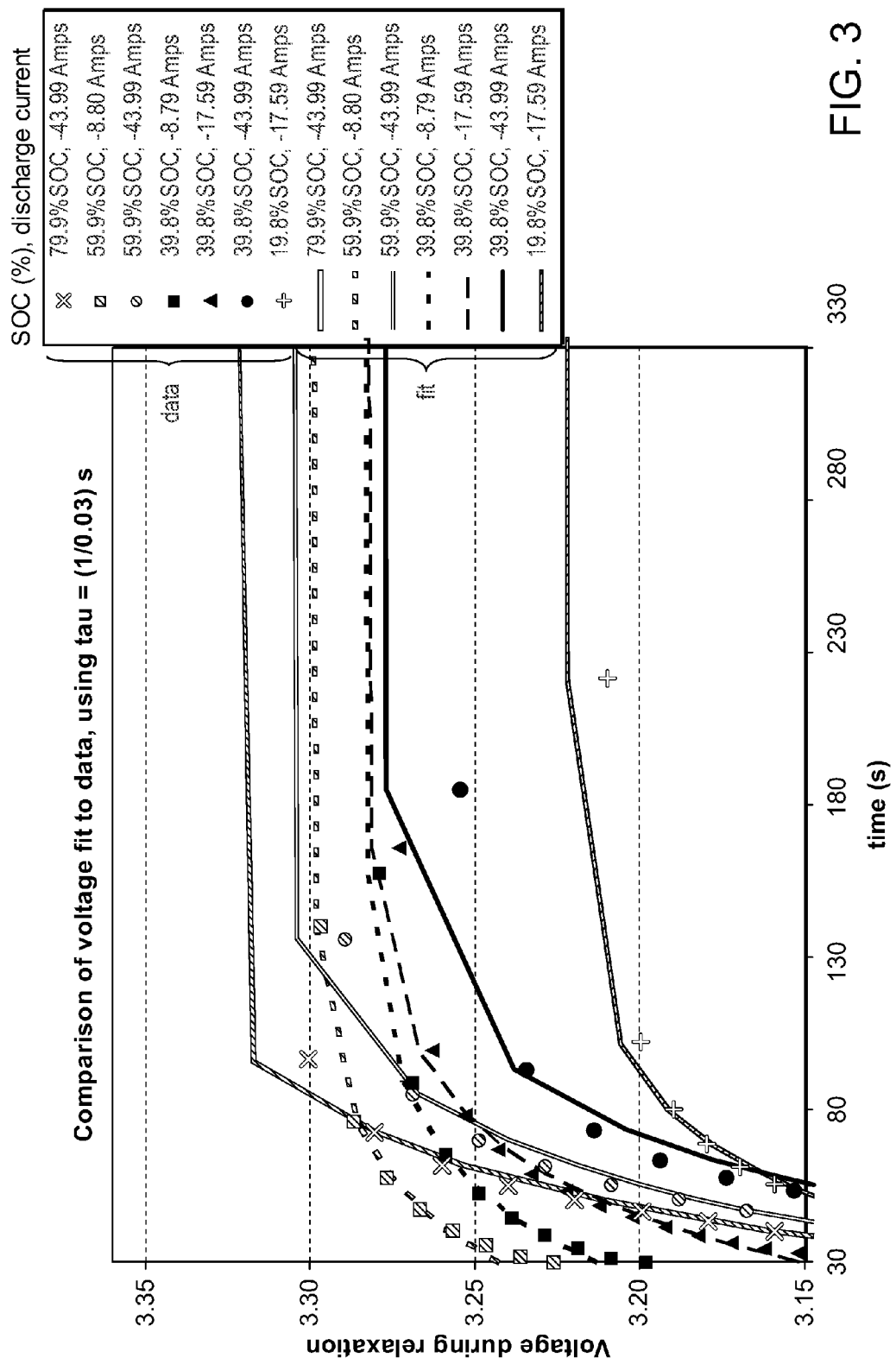
FIG. 3 shows fitting to relaxation data plotted versus time, for short times after interruption of current.

FIG. 3 shows fitting to relaxation data plotted versus time. These are the same data as those plotted in FIG. 2. This figure illustrates a short time view at 23° C. All of the short-time behavior can be closely matched using a single time constant of (1/0.03) seconds, fitting data between 10 and 200 seconds.

Figure 4:
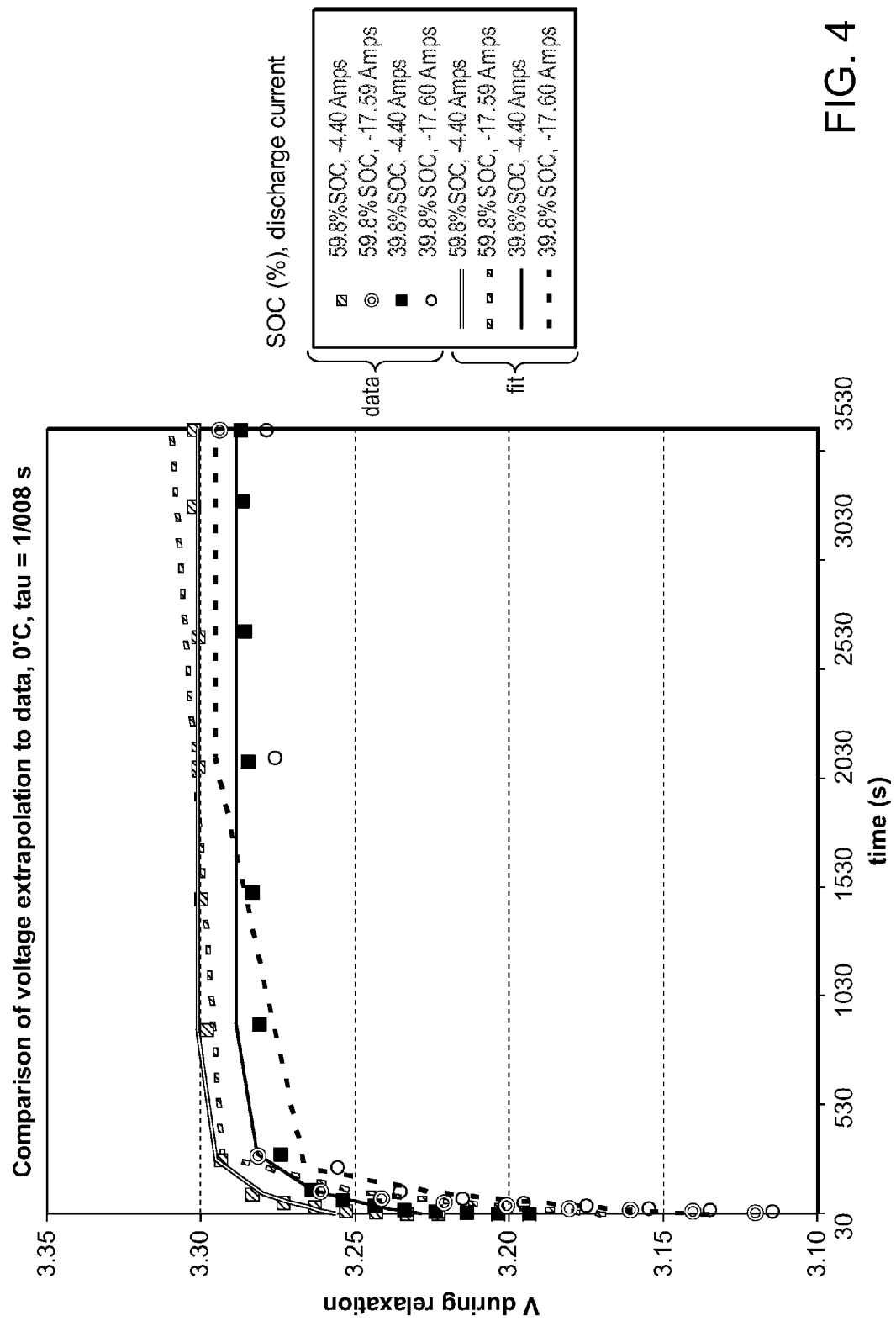
FIG. 4 shows fitting relaxation data at a different temperature in order to illustrate how tau can change with temperature and to illustrate how the fit to data at short times matches behavior at long times.

FIG. 4 shows data at a different temperature (0'C) in order to illustrate how tau can change with temperature. FIG. 4 also illustrates how well the fit predicts the true OCV. Using a time constant of (1/0.008) seconds fit to data between 30 and 200 seconds matches the OCV after 3600 seconds within 15 mV.

Other methods may also be used to determine tau. For example, one could use ac impedance, galvanostatic, or potential-sweep methods.

During a short rest period, the described embodiments can take advantage of all available voltage data to predict the true OCV, and from that the cell SOC. The method is not affected by changes in cell ohmic or charge-transfer impedance with aging, because it simultaneously regresses the OCV and the overpotential. As mentioned above, for chemistries in which the diffusion impedance changes with aging, tau can be characterized as a function of state of health. The relationship between open-circuit voltage and state of charge may include a dependence on hysteresis, e.g. by keeping track of the prior charge-discharge history of the cell to determine the present state along the path between fully-saturated charge and discharge hysteresis states.

The embodiments described herein may be implemented using any one of, or combinations of, various techniques known in the art. For example, in one embodiment the cell or battery is monitored, managed and controlled via device such as a single processor or controller. The parameters $\alpha$ and OCV may be estimated by implementing any fitting algorithm known in the art, e.g., least-squares fitting.

The device may include a digital microprocessor, FPGA, ASIC or any other electronic circuit that can measure parameters such as voltages and temperature, process those parameters and communicate them and/or processing results to an external system component.

This device may be a component of a battery management system (BMS), which performs various functions related supporting the battery or cell. The device performs the functions described herein to extrapolate the true open-circuit voltage of the battery or other energy delivery device based on voltage data available during the short rest period. If the device is a processor or controller, the device may execute instructions to perform the functions and techniques described herein. The instructions may be stored on a memory device such as FLASH, ROM, PROM, EEPROM, RAM, magnetic or optical media, or any other component known in the art for storing such instructions for recall and execution.

Figure 5:
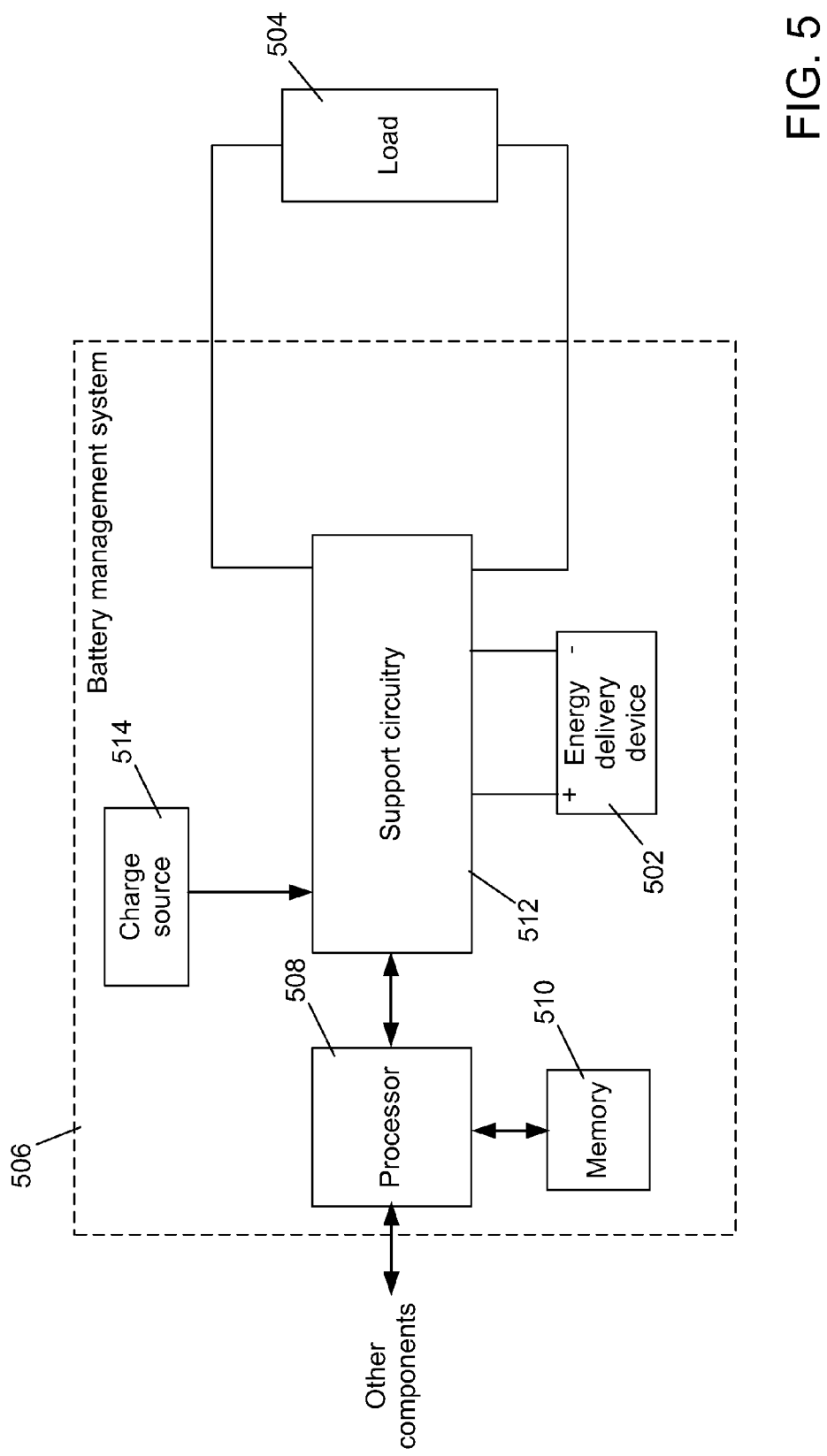
FIG. 5 shows an exemplary embodiment of a system for determining state of charge of an energy delivery device.

FIG. 5 illustrates an exemplary embodiment implementing at least some the concepts described herein. FIG. 5 shows an energy delivery device 502 electrically coupled to a load 504. A battery management system (BMS) 506 includes a processor 508 in communication with a memory device 510, support circuitry 512, and a charge source 514. The memory device 510 stores voltage vs. time data and code for execution by the processor 508, along with certain predetermined parameters such as the time constant of relaxation, tau. The support circuitry 512 includes various components of the BMS needed to implement the functionality described herein. For example, the support circuitry 512 may include a voltage measurement device necessary to sample the voltage of the energy delivery device 502, and switches for connecting and disconnecting the energy delivery device to the load 504, and components for providing charge current from the charge source 514 to the energy delivery device 502. The processor 508 may also be in communication with other components of the host system.

The embodiment shown in FIG. 5 is only an example and is not intended to be limiting in any way. The described embodiments may be implemented with other techniques known in the art. The functionality provided by the processor 508 may, in other embodiments, be implemented with other techniques known in the art. For example, the functionality could be provided by a state machine implemented on an ASIC.

Other state-of-charge estimating techniques can provide relatively accurate estimates depending on the state of the energy delivery device. For example, counting the net amp-hours through the battery provides an accurate estimate of SOC for a short period of time. However, errors accumulate as the charge-discharge cycling continues so that the amp-hour counting technique loses accuracy the longer the energy delivery device is in use, especially if there are rapid and large changes in current. Further, as implied herein, a simple measurement of the voltage across the energy delivery device can be used for an accurate estimate of SOC if there is sufficient relaxation time after current is discontinued. If the relaxation time is sufficiently long, then there is no need to extrapolate the voltage to open-circuit voltage. Thus, the decision of whether or not to extrapolate can be based on the length of time of the rest period or on other factors such as change in voltage with time.

Accordingly, the battery management system may supplement the described embodiments with, for example, components for using coulomb counting, equivalent circuit models, more sophisticated cell models, or measurements of voltage and/or temperature and/or the derivatives of voltage and/or temperature with respect to time or amp-hours. Each alternative component may provide an estimate of state of charge. A composite estimate can then be calculated by weighting each component estimate. The weighting function may be calculated as a function of an error estimate or other means of estimating the accuracy of the component algorithm as a function of cell history and conditions that exist at the time the SOC estimate is made. Any method known in the art for weighting and estimating composite state functions may be used, such as Kalman filters or other types of filters. The alternative estimates and weighted combination can be implemented in a system as shown in the exemplary embodiment of FIG. 5.

The described embodiments apply to any type of battery technology, including but not limited to lead-acid, nickel-metal hydride, lithium-ion, alkaline, and battery-capacitor hybrids, among others. Further, the described embodiments are applicable to both primary (non-rechargeable) and secondary (rechargeable) cells. The embodiments described herein may be used with respect to energy delivery devices that are individual cells, as well as energy delivery devices that are configured as a module of two or more individual cells electrically coupled together in series and/or parallel, or two or more such modules electrically coupled together in series and/or parallel to form a pack.

The invention may be embodied in other specific forms without departing from the spirit or essential characteristics thereof. The present embodiments are therefore to be considered in respects as illustrative and not restrictive.

What is claimed is:

1. A method of determining state of charge of an energy delivery device using a battery management system, comprising:

sampling, by the battery management system, voltage values presented by the energy delivery device during a relaxation period of the energy delivery device;

regressing at the battery management system, with respect to the sampled voltage values, (i) a first variable representing a real-time open circuit voltage value of the energy delivery device and (ii) a second variable representing a real-time overpotential value that describes a total overpotential being relaxed, wherein an equation used for regressing the open circuit voltage value and the overpotential value includes a time constant of relaxation, the time constant of relaxation being a fixed value that is (a) determined prior to the regressing and (b) determined as a function of the energy delivery device; and using a predetermined profile that relates open circuit voltage of the energy delivery device to state of charge of the energy delivery device, to determine a particular state of charge corresponding to the regressed open circuit voltage value.

2. The method of claim 1, wherein the equation is $$V(t) = OCV - \alpha \exp(-t/tau),$$

where $V(t)$ represents the sampled voltage values, $t$ represents times at which each of the voltage values are sampled, OCV is the first variable representing the open circuit voltage value of the energy delivery device, $\alpha$ is the second variable representing the overpotential value, and tau is the predetermined time constant of relaxation associated with the energy delivery device.

3. The method of claim 1, wherein the predetermined time constant of relaxation associated with the energy delivery device is generated by
 (i) applying a current to the energy delivery device,
 (ii) discontinuing the current after a period of time,
 (iii) recording voltages presented by the energy delivery device after the current is discontinued,
 (iv) plotting a logarithm of a plurality of differences $V_{t\_last} - V_t$, wherein $V_{t\_last}$ is a final voltage recorded after the current is discontinued and $V_t$ is a voltage recorded at time t;
 (v) determining a slope of a linear fit to the plurality of differences $V_{t\_last} - V_t$; wherein the predetermined time constant of relaxation is the inverse of the slope.

4. The method of claim 3, wherein the linear fit is determined using the differences $V_{t\_last} - V_t$ only for t greater than N seconds and less than M seconds after discontinuing the current, wherein M is a value selected according to a first time constant associated with a large diffusion component of the energy delivery device, and N is a value selected according to a second time constant associated with the energy delivery device that is substantially smaller than the first time constant.

5. The method of claim 3, wherein the predetermined time constant of relaxation is generated as a function of temperature of the energy delivery device.

6. The method of claim 3, wherein the predetermined time constant is determined as a function of state of health of the energy delivery device.

7. The method of claim 1, wherein the predetermined time constant of relaxation is chosen with respect to a measured temperature of the energy delivery device.

8. The method of claim 1, wherein a sampling interval associated with the sampling is chosen as a function of the predetermined time constant of relaxation of the energy delivery device.

9. The method of claim 1, wherein the regression uses only the sampled voltage values that were sampled more than N seconds after beginning the relaxation period.

10. The method of claim 1, further including combining the determined particular state of charge with one or more state of charge estimates determined by alternative estimating techniques.

11. The method of claim 10, wherein the alternative estimating techniques includes at least one of (i) coulomb counting, (ii) evaluation of an equivalent circuit model corresponding to the energy delivery device, (iii) evaluation of a physical cell model corresponding to the energy delivery device, (iv)

measurements of one or more of voltage, temperature, a derivative of voltage and a derivative of temperature.

12. The method of claim 10, wherein the combining includes calculating a weighted sum of the determined particular state of charge and the one or more state of charge estimates determined by alternative techniques.

13. An apparatus for determining state of charge of an energy delivery device, comprising:
   a voltage measurement device for sampling voltage values presented by the energy delivery device during a relaxation period of the energy delivery device;
   a processor for regressing, with respect to the sampled voltage values, (i) a first variable representing a real-time open circuit voltage value of the energy delivery device and (ii) a second variable representing a real-time overpotential value that describes a total overpotential being relaxed, wherein equation used for regressing the open circuit voltage value and the overpotential value includes a time constant of relaxation, the time constant of relaxation being a fixed value that is (a) determined prior to the regressing and (b) determined as a function of the energy delivery device; and
   using a predetermined profile that relates open circuit voltage of the energy delivery device to state of charge of the energy delivery device, to determine a particular state of charge corresponding to the regressed open circuit voltage value.

14. The apparatus of claim 13, wherein the equation is $$V(t) = OCV - \alpha \exp(-t/tau),$$

where $V(t)$ represents the sampled voltage values, t represents times at which each of the voltage values are sampled, OCV is the first variable representing the open circuit voltage value of the energy delivery device, $\alpha$ is the second variable representing the overpotential value, and tau is the predetermined time constant of relaxation associated with the energy delivery device.

15. The apparatus of claim 13, wherein the predetermined time constant of relaxation is chosen with respect to a measured temperature of the energy delivery device.

16. The apparatus of claim 13, wherein a sampling interval associated with the sampling is chosen as a function of the predetermined time constant of relaxation of the energy delivery device.

17. The apparatus of claim 13, wherein the regression uses only the sampled voltage values that were sampled more than N seconds after beginning the relaxation period.

18. The apparatus of claim 13, wherein the determined particular state of charge is combined with one or more state of charge estimates determined by alternative estimating techniques.

19. The apparatus of claim 18, wherein the alternative estimating techniques includes at least one of (i) coulomb counting, (ii) evaluation of an equivalent circuit model corresponding to the energy delivery device, (iii) evaluation of a physical cell model corresponding to the energy delivery device, (iv) measurements of one or more of voltage, temperature, a derivative of voltage and a derivative of temperature.

20. The apparatus of claim 18, wherein the combination of the determined particular state of charge and the one or more state of charge estimates determined by alternative estimating includes a weighted sum of the determined particular state of charge and the one or more state of charge estimates determined by alternative techniques.

21. A computer program product, including a non-transitory computer usable medium having a computer readable program code embodied therein, the computer readable program code adapted to be executed to implement a method of determining state of charge of an energy delivery device, the medium holding one or more instructions for:
   sampling voltage values presented by the energy delivery device during a relaxation period of the energy delivery device;
   regressing, with respect to the sampled voltage values, (i) a first variable representing a real-time open circuit voltage value of the energy delivery device and (ii) a second variable representing a real-time overpotential value that describes a total overpotential being relaxed, wherein an equation used for regressing the open circuit voltage value and the overpotential value includes a time constant of relaxation, the time constant of relaxation being a fixed value that is (a) determined prior to the regressing and (b) determined as a function of the energy delivery device; and
   using a predetermined profile that relates open circuit voltage of the energy delivery device to state of charge of the energy delivery device, to determine a particular state of charge corresponding to the regressed open circuit voltage value.

22. The computer program product of claim 21, wherein the equation is $$V(t) = OCV - \alpha \exp(-t/tau),$$

where $V(t)$ represents the sampled voltage values, t represents times at which each of the voltage values are sampled, OCV is the first variable representing the open circuit voltage value of the energy delivery device $\alpha$ is the second variable representing the overpotential value, and tau is the predetermined time constant of relaxation associated with the energy delivery device.

* * * * *